(12) United States Patent
Marino et al.

(10) Patent No.: US 7,176,818 B2
(45) Date of Patent: Feb. 13, 2007

(54) ANALOG TO DIGITAL CONVERTER, RELATED METHOD AND USE IN VOLTAGE REGULATOR CIRCUITS

(75) Inventors: Filippo Marino, Tremestieri Etneo (CT) (IT); Eliana Cannella, Palermo (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 11/176,153

(22) Filed: Jul. 6, 2005

(65) Prior Publication Data

US 2006/0007032 A1    Jan. 12, 2006

(30) Foreign Application Priority Data

Jul. 9, 2004    (EP)    ................... 04425499

(51) Int. Cl.
*H03M 3/00*    (2006.01)
(52) U.S. Cl. ....................... 341/143; 341/155
(58) Field of Classification Search ................ 341/144, 341/155, 143, 122
See application file for complete search history.

(56) References Cited

U.S. PATENT DOCUMENTS

| 4,618,850 A | * | 10/1986 | Lenhoff, Jr. ................. 341/118 |
| 4,999,624 A | * | 3/1991 | Pichlik ........................ 341/118 |
| 6,999,014 B2 | * | 2/2006 | Oliaei et al. ................. 341/143 |
| 2003/0080888 A1 | * | 5/2003 | Muhammad et al. ....... 341/143 |

FOREIGN PATENT DOCUMENTS

GB    2 202 702 A    9/1988

OTHER PUBLICATIONS

Xiao, et al. "Architecture and IC Implementation of a Digital VRM Controller"; 32nd Annual IEEE Power Electronics Specialists Conference, PESC 2001. Conference Proceedings, Vancouver, Canada, Jun. 17-21, 2001, Annual Power Electronics Specialists Conference, New York, NY; IEEE; vol. 1 of 4; 2001; pp. 38-47.

\* cited by examiner

*Primary Examiner*—Peguy JeanPierre
(74) *Attorney, Agent, or Firm*—Hogan & Hartson LLP

(57) ABSTRACT

An apparatus adapted to convert an input analog signal to an output digital signal includes means adapted to convert a first digital value of the output signal of the apparatus to a first analog value (IN1), wherein the first digital value is emitted by the apparatus at a first time instant, and also means for feeding back the first analog value to the input of the apparatus. The apparatus includes first means adapted to determine the difference between the first analog value and a second analog value (IN) of the input signal at a second time instant successive to the first time instant. The apparatus also includes second means adapted to convert the difference to a digital value and third means adapted to add or subtract the digital value of the difference to or from said first digital value by obtaining the output digital signal.

8 Claims, 4 Drawing Sheets

ANALOG TO DIGITAL CONVERTER, RELATED METHOD AND USE IN VOLTAGE REGULATOR CIRCUITS

RELATED APPLICATION

The present invention claims priority from European Application No. EP 04425499.3 filed Jul. 9, 2004, which is incorporated herein in its entirety by this reference.

1. Field of the Invention

The present invention relates to an apparatus to convert an analog signal to a digital signal, to a related method and to a voltage regulator control circuit incorporating the apparatus.

2. Background of the Invention

The use of voltage regulators in electronic devices is known. Voltage regulators must produce an output voltage signal from an input voltage signal, which must track a reference voltage within some regulation tolerance. Such voltage regulators can be controlled in analog or digital way. In the case wherein the voltage regulator is controlled in a digital way, an analog-digital converter must be placed in feedback to it as shown in FIG. 1 wherein the analog-digital converter 10 is placed in the feedback loop between the output Vo of the voltage regulator 20, which has the input voltage Vi, and the input of the digital controller 30. The input signal of the block 30 is given by the difference between the digital signal coming from the block 10 and the reference signal Vref. The block 10 must convert into digital the analog voltage Vo provided by the regulator 20.

Since the analog-digital converter 10 is placed inside the control ring, it must introduce a delay as small as possible, with the delay corresponding to a phase shift which can make the loop unstable. For this reason an analog-digital converter of the flash type is used. With such a converter it is necessary to have a great number of comparators to obtain a digital signal with a significant number of bits. For example, to obtain an output digital signal with eight bits, 255 comparators are necessary. If a converter of the half flash type is used, the number of comparators to be used decreases but signal conversion time increases.

SUMMARY OF THE INVENTION

In view of the state of the art described, it is an object of the present invention to provide an apparatus for converting an analog signal to a digital signal which shows a minimum delay with a reduced number of comparators.

According to the present invention, this object is obtained by means of an apparatus adapted to convert an input analog signal to an output digital signal. The apparatus includes means adapted to convert a first digital value of the output signal of said apparatus to a first analog value and means for feeding back to said first analog value the input of the apparatus. The first digital value is emitted by the apparatus at a first time instant. The apparatus further includes first means adapted to determine the difference between the first analog value and a second analog value of the input signal of the apparatus at a second time instant successive to the first time instant, second means adapted to convert said difference to a digital value and third means adapted to add or subtract said digital value of said difference to or from said first digital value thereby obtaining said output digital signal.

The present invention also includes a method for converting an analog signal to a digital signal by converting a first digital value emitted by an apparatus at a first time instant to a first analog value, carrying at the input of the apparatus the first analog value, determining the difference between the first analog value and a second analog value in input to the apparatus at a second time instant successive to the first time instant, converting the difference to a digital value, and obtaining an output digital signal of the apparatus by adding or subtracting the digital value of the difference to or from the first digital value.

The present invention also includes a voltage regulator control circuit which includes a digital controller and the analog to digital conversion apparatus of the present invention, which operates on the output signal of the apparatus of the present invention. The digital controller takes an input of the difference between a reference signal and the output signal of the apparatus of the present invention and acts upon the voltage regulator.

Thanks to the present invention it is possible to provide an apparatus for converting an analog signal to a digital signal which occupies, in the chip where it is integrated, a smaller area than that of the known analog-digital converters.

BRIEF DESCRIPTION OF THE DRAWINGS

The features and the advantages of the present invention will be made evident by the following detailed description of an embodiment thereof, shown as not limiting example in the annexed drawings, wherein.

DETAILED DESCRIPTION

Figure 2:
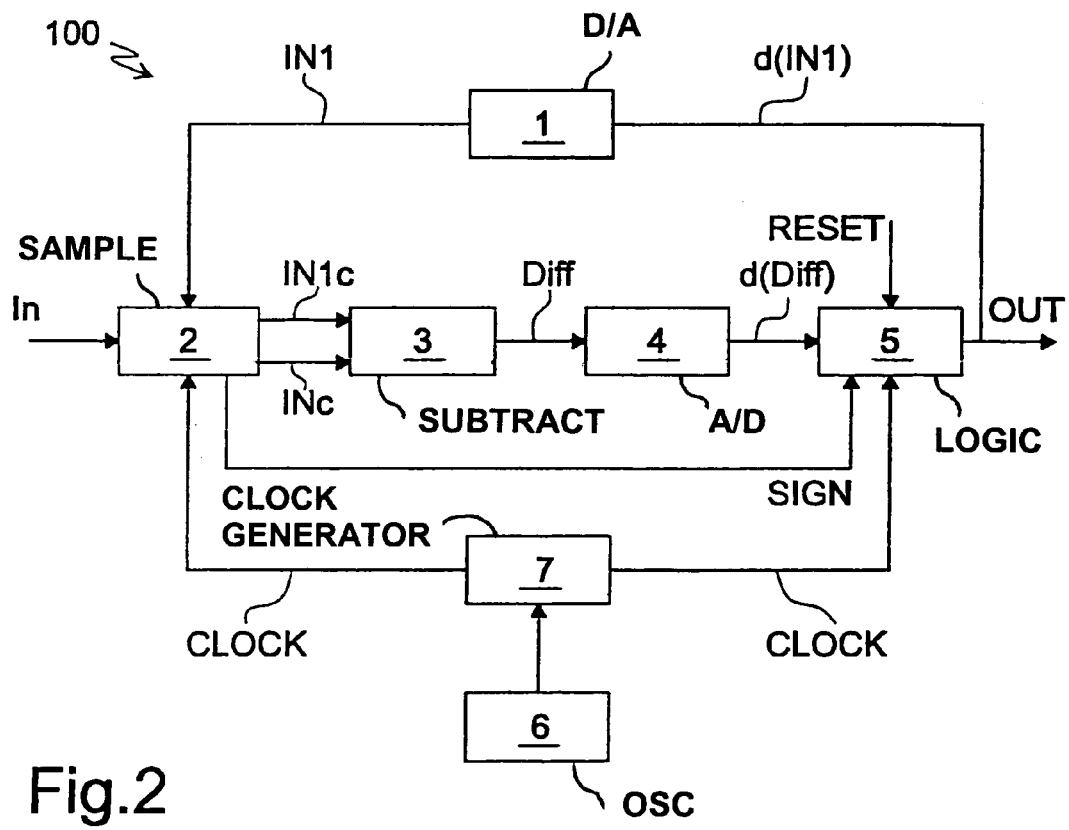
FIG. 2 shows a diagram of the apparatus for converting an analog signal to a digital signal according to present invention.

With reference to FIG. 2 a block diagram of an apparatus 100 for converting an analog signal IN to a digital signal OUT according to present invention is shown. In the apparatus 100 the input signal IN and the signal IN1 deriving from a digital-analog converter 1 are sent to a sample block 2 that samples both the signals. The sampled signal INc and IN1c are sent to a subtractor block which determines the difference between two signals. The analog signal Diff in output from the block 3 is sent to a block 4 that converts the analog signal to digital and the digital signal d(Diff) which is obtained is sent to the input of a logic block 5 adapted to sum said digital signal d(Diff) with the digital signal obtained by means of the preceding conversion. The sum digital signal represents the output signal OUT of the apparatus 100.

The apparatus 100 comprises also a block 6, constituted for example by an oscillator, adapted to send a clock signal to a block 7 adapted to produce the clock pulses CLOCK which are necessary for the correct operation of the sampler 2 and the logic block 5.

The digital signal d(Diff) obtained by means of the subtractor 3 and the block 4 represents the variation of the present signal value with respect to the value of the signal at the preceding sample time, therefore if one still indicates with IN the value of the signal In in input to the apparatus 100 at the i-th time and IN1 the value of the signal In at the i-1-th preceding time, the digital signal d(Diff) is the variation IN-IN1 expressed in digital. Since normally, that is in the normal operative conditions and preferably in the case of a voltage regulator, at regime the input signal IN presents small variations with respect to the output signal OUT, it will be obtained that among the bits provided by the block 5 only the least significant bits will vary while the more significant bits remain unchanged. In such case it is possible to use an analog-digital converter 4 which has a high resolution (for example 5 mV of the quantization step) only for a small voltage range (for example with a width of 40 mV).

The block 2 beyond to sample the analog signals at its input, that is the signal IN and the signal IN1 deriving from the converter 1, is adapted to compare them for generating a signal SIGN representing the plus or minus sign which must be provided to the logic block 5 in accordance if the signal IN is higher or lower than the signal IN1. Said block 2 is adapted to send the sampled signals INc and IN1c to the subtractor block 3 so that the output, that is the difference signal, is always positive.

The logic block 5 receives the digital signal in output from the block 4 and, in accordance with the sign of the difference Diff which is provided by the signal SIGN, sums or subtracts the digital difference signal d(Diff) to the preceding calculated digital value. Therefore if the signal SIGN is high the digital signal d(Diff) is summed with the preceding calculated digital value d(IN1) while if the signal SIGN is low the signal d(Diff) is subtracted from the value d(IN1). If an analog-digital conversion apparatus at height bits is to be formed, said apparatus must provide levels comprised between 0 and $2^8-1$, that is between 0 and 255, therefore the block 5 must provide values comprised between said levels.

The block 5 has even other two inputs; a clock signal CLOCK that allows to synchronize the operation of the analog part with the digital part and an external reset signal RESET to set the output to zero.

Figure 3:
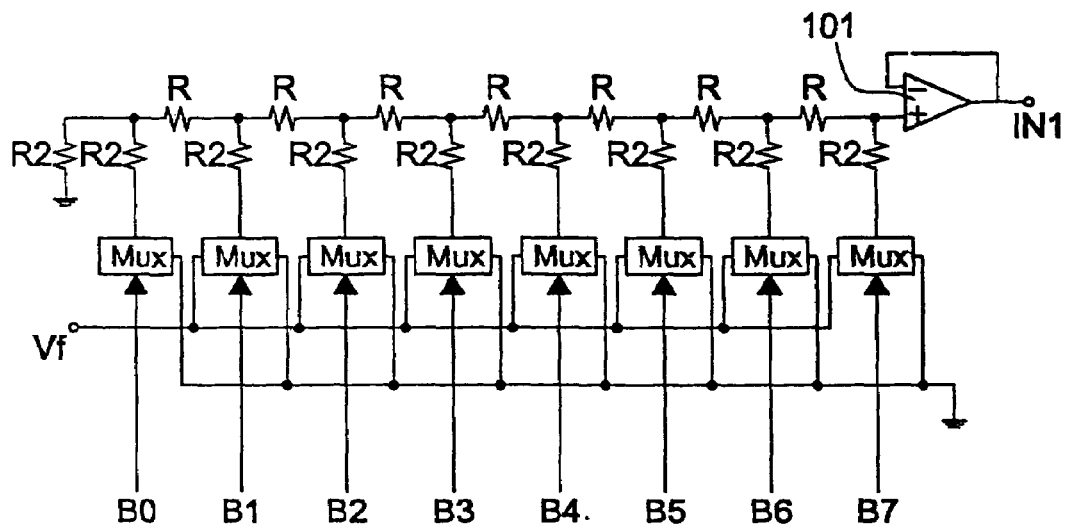
FIG. 3 shows a circuit implementation of the block 1 in FIG. 2.

The digital-analog converter 1 can be of the type at 8 bits B0–B7 and, form example, can be formed as the circuit in FIG. 3. The converter 1 comprises a buffer 101 with the non-inverting terminal of which a circuit line is connected which is constituted by a succession of seven resistances R placed in series and each one connected with a resistance R2 which has a double value with respect to the resistance R. Among the eight resistances R2, the resistance R2 connected with the first resistance R of the succession is connected to ground while each one of the other resistances R2 is connected with a switch Mux driven by one of the bits B0–B7. The switch Mux can connect the resistance R2 with a full scale voltage Vf or to ground according to the value of the driving bit B0–B7, for example, if the bit B0–B7 is zero the switch Mux connects the resistance R2 to ground while if the bit B0–B7 is one the switch Mux connects the resistance R2 with the voltage Vf.

Figure 4:
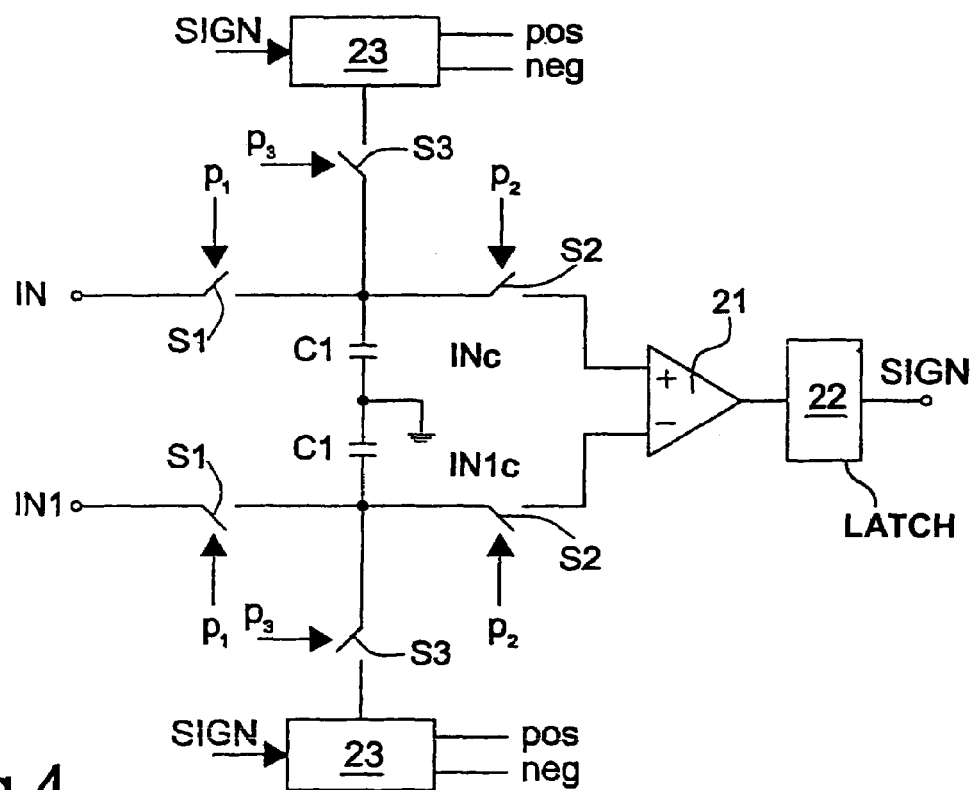
FIG. 4 shows a circuit implementation of the block 2 in FIG. 2.

The block 2 can be formed by means of a switching capacitance technology. In FIG. 4 a possible diagram of a circuit implementing the block 2 is shown. Two switches S1 are placed in two circuit lines between two terminals wherein two signals IN and IN1 and two capacitors C1 connected to ground are present. The switches S1 are driven by the signal p1 which controls the closure of S1 and the successive opening for memorizing the signals IN and IN1. Other two switches S2 are placed between the terminals, which are not connected to ground, of the capacitors C1 and the non-inverting and inverting terminals of an operational amplifier 21 operating as a comparator and they are controlled by means of a signal p2. After the opening of the switches S1, the switches S2 are closed for connecting the signals INc and IN1c with the non-inverting and inverting terminals of the operational amplifier 21; the output of the last is high if INc>IN1c while is low if INc<IN1c. Said output is memorized in a latch block 22 the output of which represents the signal SIGN.

With the terminals of two capacitors C1 two switches S3 are connected which are driven by a signal p3 and which are connected with two blocks 23 driven by the signal SIGN. When p3 controls the closure of the switches S3, after the opening of the switches S2, the signal INc is present at the output pos and the signal IN1c at the output neg or vice versa according to the fact that INc is higher or lower than IN1c.

Figure 5:
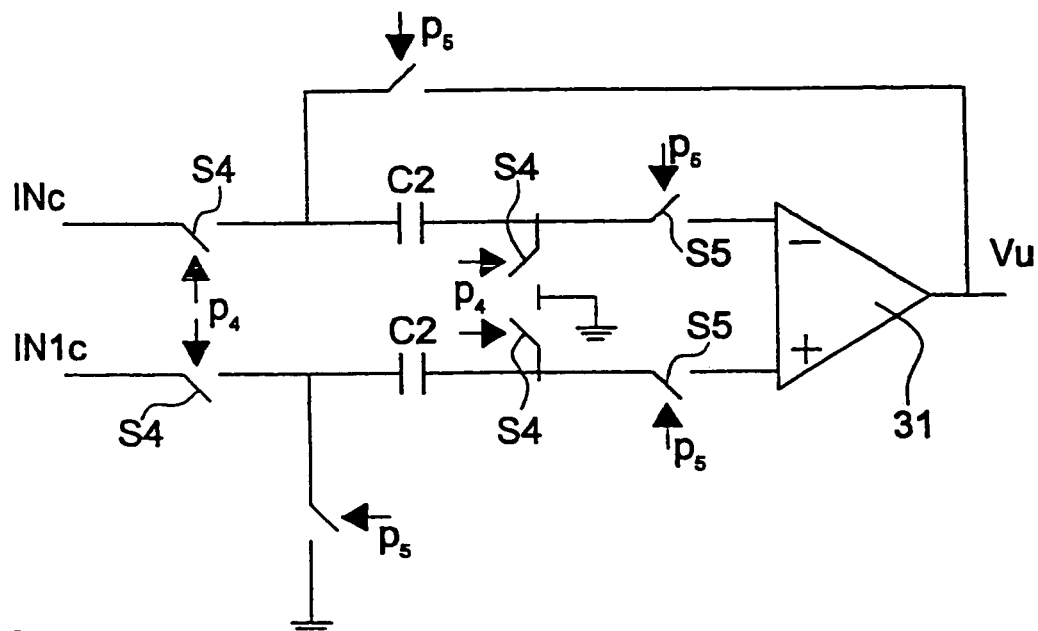
FIG. 5 shows a circuit implementation of the block 3 in FIG. 2.

The subtractor block 3 can be formed as shown in FIG. 5 where two voltages INc and IN1c are sent, by means of two switches S4 driven by a signal p4, for loading two capacitors C2 connected to ground by means of other two switches S4 driven by the signal p4; then the capacitors C2 are connected with the inverting and non-inverting terminals of an operational amplifier 31 by means of switches S5 driven by the signal p5 and, always by means of a switch S5 closed by a signal p5, there is the connection of the output of the amplifier 31 with a capacitor C2 and the connection of a terminal of the other capacitor C2 to ground by means of a switch S5 closed by means of the signal p5. In such a way the capacitor C2, at the terminals of which the voltage INc is present, is connected between the inverting terminal and the output of the amplifier 31 while the capacitor C2 at the terminals of which the voltage IN1c is present, is connected between the non-inverting terminal of the amplifier 31 and ground; the output voltage Vu makes the difference Diff between two signals.

Figure 6:
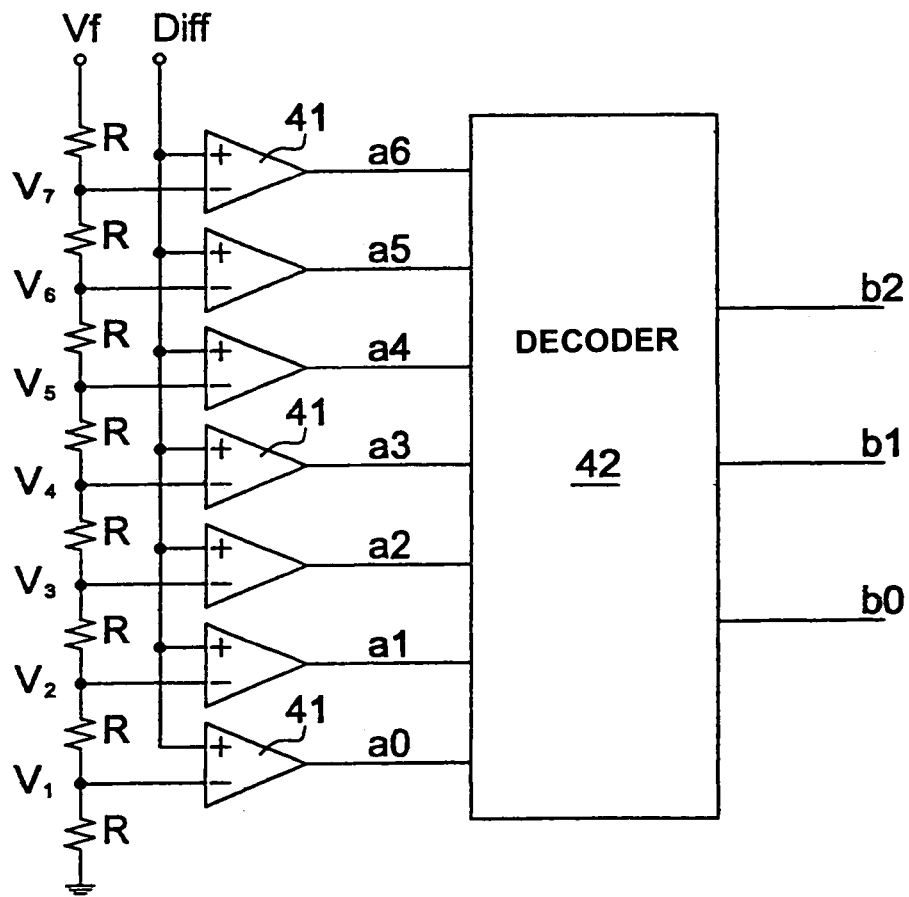
FIG. 6 shows a circuit implementation of the block 4 in FIG. 2.

The block 4 is adapted to convert the analog signal deriving from the subtractor block 3 to digital. A possible analog-digital converter to use for the block 4 is shown in FIG. 6; said converter is of the flash type at 3 bits and it comprises seven operational amplifier 41 each one forming a comparator. At the non-inverting input of each comparator 41 the analog signal Diff in output from the block 3 is present while at the inverting input a signal provided with a resistive network operating as a voltage divider is present. Said network is comprised between the full-scale voltage Vf and ground and it divides the voltage Vf in eight quantization levels, that is $V_1$–$V_7$ and Vf, by means of eight resistances R placed in series with each other. If for a comparator 41 the value of the signal Diff is higher than that of the signal at the inverting terminal, a high voltage level is provided at the output, that is the comparator saturates high. The outputs of the comparators are sent to a thermometric decoder 42 which counts the number of the ones present at its input and which provides an output relative binary code. The thermometric decoder 42 implements the following truth table:

| a6 | a5 | a4 | a3 | a2 | a1 | a0 | b2 | b1 | b0 |
|---|---|---|---|---|---|---|---|---|---|
| 0 | 0 | 0 | 0 | 0 | 0 | 0 | 0 | 0 | 0 |
| 0 | 0 | 0 | 0 | 0 | 0 | 1 | 0 | 0 | 1 |

-continued

| a6 | a5 | a4 | a3 | a2 | a1 | a0 | b2 | b1 | b0 |
|---|---|---|---|---|---|---|---|---|---|
| 0 | 0 | 0 | 0 | 0 | 1 | 1 | 0 | 1 | 0 |
| 0 | 0 | 0 | 0 | 1 | 1 | 1 | 0 | 1 | 1 |
| 0 | 0 | 0 | 1 | 1 | 1 | 1 | 1 | 0 | 0 |
| 0 | 0 | 1 | 1 | 1 | 1 | 1 | 1 | 0 | 1 |
| 0 | 1 | 1 | 1 | 1 | 1 | 1 | 1 | 1 | 0 |
| 1 | 1 | 1 | 1 | 1 | 1 | 1 | 1 | 1 | 1 | where a0–a6 are the outputs of the comparators 41 and b0–b2 are the outputs of the thermometric decoder 42.

Figure 7:
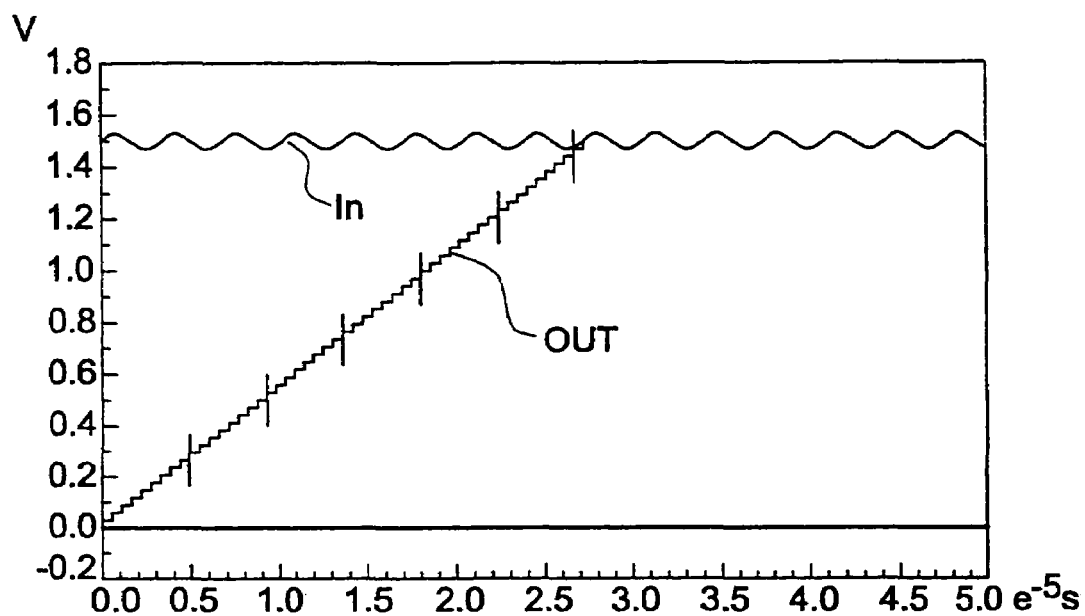
FIG. 7 shows a time diagram of the signals In and OUT which is obtained by means of simulations.
Figure 8:
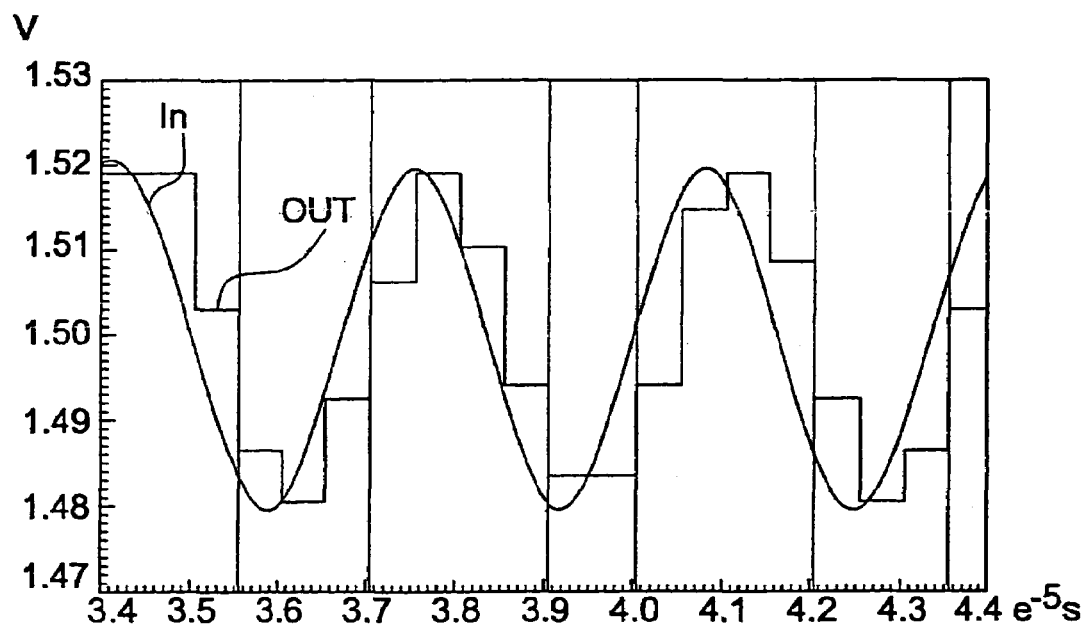
FIG. 8 shows in more detail a part of the time diagram in FIG. 7.

In FIGS. 7 and 8 a graph of the input signal In and of the output signal OUT of the apparatus 100 is shown which is obtained by means of simulations by using an input sinusoidal signal at a frequency of 300 Khz and by using a sample frequency equal to 2 Mhz; the output signal OUT follows the waveform of the input signal In to lock it.

Figure 1:
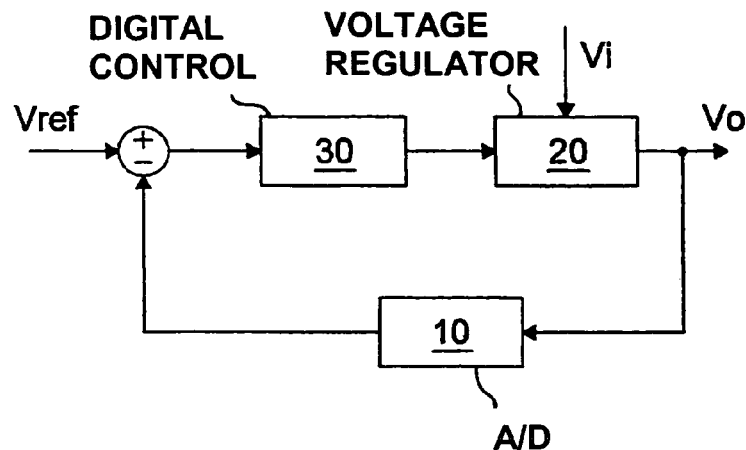
FIG. 1 shows a diagram of a control ring of a voltage regulator with an analog-digital converter according to prior art.

The apparatus 100 may be used in the place of the converter 10 in the control circuit of the voltage regulator 20 in FIG. 1. In such a way a new control circuit of a voltage regulator is formed which comprises a digital controller 30 and an apparatus 100 for analog to digital conversion of the output signal of said voltage regulator 20. The controller 30 has in input the difference between the reference signal Vref and the output signal of the apparatus 100 and it acts on the voltage regulator 20.

According to the invention it is also possible to provide a method for converting an analog signal to a digital signal by means of the apparatus 100. The method comprises a first step for converting a first digital value d(IN1), emitted by the apparatus at a first time instant, to a first analog value IN1 and to feedback to the input of the apparatus 100 said first analog value IN1. The method comprises a second step for determining the difference Diff between the first analog value IN1 and a second analog value IN in input to the apparatus 100 at a second time instant successive to the first time instant, a third step for converting said difference Diff to digital value d(Diff) and a fourth step for obtaining said output digital signal OUT of the apparatus 100 by adding or subtracting the digital value d(Diff) of the difference to said first digital value.

The second step comprises a sub-step for sampling said first and second analog values and another sub-step for determining the difference of said two sampled analog values INc and IN1c.

The second step comprises a further step for comparing said two sampled analog values and emitting a signal SIGN representative of said comparison on the base of which the addition or the subtraction of said digital value d(Diff) of the difference to said first digital value d(IN1) will be in the third step.

The invention claimed is:

1. An analog-to-digital converter to convert an input analog signal to an output digital signal, comprising: a digital-to-analog converter to convert a first digital value of the output digital signal to a first analog value and for feeding back said first analog value to the input of the analog-to-digital converter, said first digital value being emitted by the analog-to-digital converter at a first time instant;

first means to determine the difference between the first analog value and a second analog value of the input signal of analog-to-digital converter at a second time instant successive to the first time instant;

second means to convert said difference to a digital value; and third means to add or subtract said digital value of said difference to or from said first digital value by obtaining said output digital signal, wherein said first means comprises circuitry to sample said first analog value and said second analog value and to determine the difference between said sampled analog values, and wherein said first means comprises circuitry to compare said sampled analog values and to send a signal representative of said comparison to said third means which, in dependence on it, add or subtract said digital value of said difference to said first digital value by obtaining said output digital signal.

2. The analog-to-digital converter according to claim 1, wherein said input analog signal in input is variable.

3. The analog-to-digital converter according to claim 2, wherein said third means comprises a quantization step of 5 mV for a voltage range of 40 mV.

4. The analog-to-digital converter according to claim 1, further comprising a clock generator to generate clock pulses to synchronize said first means and said third means.

5. The analog-to-digital converter according to claim 1, further comprising a reset signal input to said third means.

6. A method for converting an analog signal to a digital signal comprising;

converting a first digital value, at a first time instant, to a first analog value;

determining the difference between the first analog value and a second analog value at a second time instant successive to the first time instant;

converting said difference to a digital value;

providing an output digital signal by adding or subtracting said digital value of said difference to or from said first digital value;

determining the difference of said two sampled analog values;

comparing said two sampled analog values and emitting a signal representative of said comparison; and providing a sign signal to a logic block which receives the digital difference signal and which provides the output digital signal.

7. The method according to claim 6, further comprising sampling said first and second analog values.

8. An analog-to-digital converter circuit comprising:

a sampler for receiving an analog input signal and for providing first and second output signals at first and second time instants, the second time instant successive to the first time instant;

a subtractor for receiving the first and second output signals and for providing an analog difference signal;

an analog-to-digital block for receiving the analog difference signal and for generating a digital difference signal;

logic circuitry for receiving the digital difference signal and for providing a digital output signal; and a digital-to-analog converter having an input for receiving the digital output signal and an output coupled to said sampler, and wherein said sampler also provides a sign signal directly to said logic block.

* * * * *